United States Patent [19]

Sakai et al.

[11] Patent Number: 5,493,769
[45] Date of Patent: Feb. 27, 1996

[54] METHOD OF MANUFACTURING ELECTRONIC COMPONENT AND MEASURING CHARACTERISTICS OF SAME

[75] Inventors: Norio Sakai; Kenji Kubota, both of Kyoto, Japan

[73] Assignee: Murata Manufacturing Co., Ltd., Japan

[21] Appl. No.: 284,150

[22] Filed: Aug. 2, 1994

[30] Foreign Application Priority Data

Aug. 5, 1993 [JP] Japan .................................. 5-194863

[51] Int. Cl.$^6$ ................................................. H01R 43/00
[52] U.S. Cl. .......................... 29/593; 29/25.42; 29/602.1; 29/854
[58] Field of Search ................................ 29/25.42, 25.35, 29/854–856, 852, 853, 593, 602.1

[56] References Cited

U.S. PATENT DOCUMENTS 4,821,007  4/1989  Fields et al. ........................ 29/852 X
5,140,745  8/1992  McKenzie, Jr. ........................ 29/852

*Primary Examiner*—Carl E. Hall
*Attorney, Agent, or Firm*—Ostrolenk, Faber, Gerb & Soffen

[57] ABSTRACT

A method of manufacturing a multilayer electronic component having one major surface which can be completely used as a mounting surface for another electronic component to form a composite component includes the steps of forming a groove in the mother laminate along a cutting line, forming external electrodes on side surfaces of the groove and then dividing the mother laminate along the cutting line to divide the groove thereby forming a plurality of multilayer electronic components that are independent of each other. The method of forming the electronic components allows for measuring electrical characteristics of the individual multilayer electronic components while the components are still part of the mother laminate.

8 Claims, 3 Drawing Sheets

METHOD OF MANUFACTURING ELECTRONIC COMPONENT AND MEASURING CHARACTERISTICS OF SAME

BACKGROUND OF THE INVENTION

1. Field of the Invention

The present invention relates to a multilayer electronic component having internal circuit elements located at an interior portion thereof, a method of manufacturing such multilayer electronic components and a method of measuring characteristics thereof, and more particularly, the invention relates to an improvement in a method of forming external electrodes in such a multilayer electronic component.

2. Description of the Background Art

A multilayer electronic component such as a multilayer capacitor, a multilayer inductor, a multilayer circuit board or a multilayer composite electronic component, for example, comprises a laminate which is formed by stacking a plurality of insulating sheets having internal circuit elements such as conductor films and/or resistor films formed thereon. The insulating sheets are typically prepared from ceramic sheets.

FIG. 6 is a perspective view showing a conventional multilayer electronic component 1. The multilayer electronic component 1 comprises a laminate 2, which is formed by stacking a plurality of insulating sheets having internal circuit elements (not shown) formed thereon. External electrodes 3 are formed on four side surfaces, for example, of the laminate 2, respectively. These external electrodes 3 are electrically connected with the internal circuit elements which are positioned in the interior of the laminate 2. While the external electrodes 3 are formed by applying suitable metal films to specific portions of the respective side surfaces of the laminate 2 relatively wide, parts of the external electrodes 3 must extend toward upper and lower major surfaces of the laminate 2.

Such a multilayer electronic component 1 is surface-mounted on a circuit board through the external electrodes 3, in the form of a chip.

In the aforementioned multilayer electronic component 1, however, the external electrodes 3 are formed to extend toward the upper and lower major surfaces of the laminate 2 with relatively wide areas. When another electronic component is mounted on either major surface of the multilayer electronic component 1 to form a composite component an area capable of mounting such an electronic component is limited.

In order to manufacture such multilayer electronic components 1, the laminate 2 is independently prepared for each multilayer electronic component 1 and then provided with the aforementioned external electrodes 3. The laminate is subjected to formation of a resistor film on its surface, trimming of the resistor film, measurement of electric characteristics, formation of an overcoat and the aforementioned mounting of another electronic component as needed. However, it is relatively complicated and difficult to accurately carry out such steps for each laminate 2 after manufacturing the multilayer electronic component 1. Thus, a more efficient method of multilayer electronic components is required.

SUMMARY OF THE INVENTION

Accordingly, an object of the present invention is to provide a multilayer electronic component which can provide a greater area for mounting another electronic component to form a composite component.

Another object of the present invention is to provide a method for efficiently manufacturing a plurality of multilayer electronic components.

Still another object of the present invention is to provide a method for efficiently measuring characteristics of a plurality of multilayer electronic components.

A multilayer electronic component according to the present invention, which is formed by stacking a plurality of insulating sheets having an internal circuit element, comprises a laminate having first and second opposite major surfaces and a side surface connecting these major surfaces with each other, and an external electrode which is electrically connected with the internal circuit element and formed on an outer surface of the laminate. In order to solve the aforementioned technical problems, the external electrode is formed to extend from the side surface of the laminate toward the first major surface without extending onto the second major surface.

A method of manufacturing multilayer electronic components according to the present invention comprises the steps of preparing a mother laminate, to be cut along a prescribed cutting line for obtaining a plurality of multilayer electronic components, each of which is formed by stacking a plurality of mother insulating sheets having internal circuit elements for distributing the internal circuit elements for the respective multilayer electronic components in respective regions divided by the cutting line, forming a groove in the mother laminate along the cutting line, applying external electrodes on side surfaces of the groove to be electrically connected with the internal circuit elements, and dividing the mother laminate in the position of the groove.

A method of measuring characteristics of multilayer electronic components according to the present invention comprises the steps of preparing a mother laminate, to be cut along a prescribed cutting line for obtaining a plurality of multilayer electronic components, each of which is formed by stacking a plurality of mother insulating sheets having of internal circuit elements for distributing the internal circuit elements for the respective multilayer electronic components in respective regions divided by the cutting line, forming a groove in the mother laminate along the cutting line, applying external electrodes on side surfaces of the groove to be electrically connected with the internal circuit elements, and measuring electric characteristics of the respective multilayer electronic components through the external electrodes while the multilayer electronic components are in this state.

The multilayer electronic components can be shipped in a state corresponding to an intermediate stage of the aforementioned method of manufacturing multilayer electronic components or in the method of measuring characteristics thereof, i.e., in the form of an aggregate of the multilayer electronic components including the mother laminate provided with the groove.

According to the inventive multilayer electronic component, the external electrode is formed to extend from the side surface of the laminate toward the first major surface, without extending onto the second major surface whereby the overall area of at least the second major surface of the laminate can be completely utilized as a mounting surface for another electronic component for forming a composite component. Thus, it is possible to increase density in mounting of the component.

According to the inventive method of manufacturing multilayer electronic components, the external electrodes can be applied while the components are still part of the mother laminate for providing a plurality of multilayer electronic components while the mother laminate can be subjected to formation of resistor films, trimming of the resistor films, formation of overcoats and mounting of other electronic components to form composite components with the multilayer electronic components as needed, whereby these steps can be efficiently carried out with high accuracy. Thus, the manufacturing method according to the present invention allows for efficient manufacturing of a great number of multilayer electronic components.

According to the inventive method of measuring characteristics of multilayer electronic components, the groove is formed in the mother laminate for providing a plurality of multilayer electronic components so that the plurality of multilayer electronic components are electrically independent of each other while the external electrodes are also electrically independent of each other for the respective multilayer electronic components, whereby it is possible to measure electric characteristics of the respective multilayer electronic components in a state in which the multilayer electronic components are physically mechanically integrated with each other as part of the mother laminate. Thus, it is not necessary to handle a plurality of multilayer electronic components which are physically independent of each other, whereby electric characteristics of a number of multilayer electronic components can be efficiently measured by screening, for example.

When the multilayer electronic components are shipped in the aforementioned state corresponding to an intermediate stage of the manufacturing method, i.e., in the form of an assembly of the multilayer electronic components comprising the mother laminate provided with the groove to be subjected to characteristic measurement, the user can remove the respective multilayer electronic components by simply dividing the mother laminate along the groove. It is to be noted that the respective multilayer electronic components can be mounted on circuit boards with no problem in this case since characteristic measurement therefor can be already completed while the assembly of such multilayer electronic components can be more efficiently packed and handled as compared with multilayer electronic components which are in separate and independent states.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
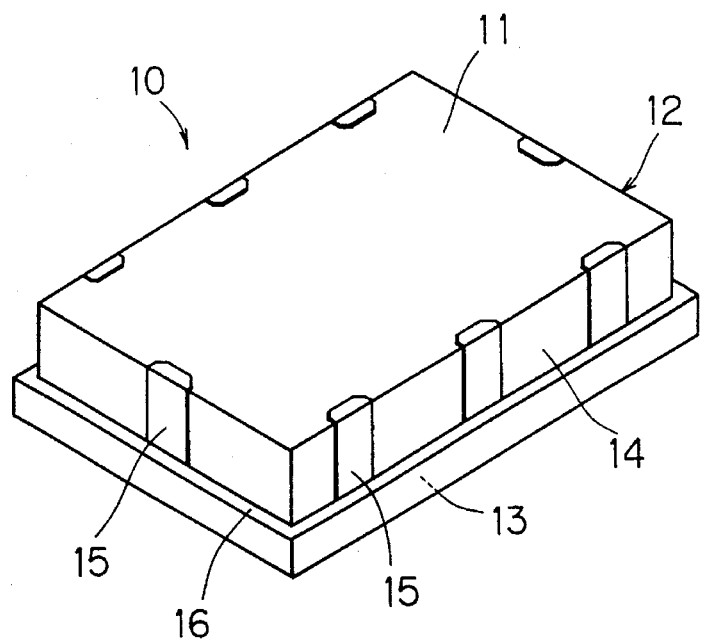
FIG. 1 is a perspective view showing the appearance of a multilayer electronic component 10 according to an embodiment of the present invention.

FIG. 1 is a perspective view of a multilayer electronic component 10 according to an embodiment of the present invention. This multilayer electronic component 10 is mounted on a circuit board in the form of a chip as illustrated. FIG. 1 shows the multilayer electronic component 10 in a state in which a first major surface 11 to be mounted on such a circuit board is facing upwardly.

The multilayer electronic component 10 comprises a laminate 12, which is formed by stacking a plurality of insulating sheets having internal circuit elements (not shown). In addition to the first major surface 11, the laminate 12 comprises a second major surface 13 which is opposed to the major surface 11, and side surfaces 14 connecting these major surfaces 11 and 13 with each other. External electrodes 15 are applied to respective side surfaces 14 of the laminate 12. These external electrodes 15 are electrically connected with the external circuit elements, although such connection is not shown in FIG. 1. While steps 16 are formed on the side surfaces 14 of the laminate 12, the reason for formation of such steps 16 is described later.

Figure 2:
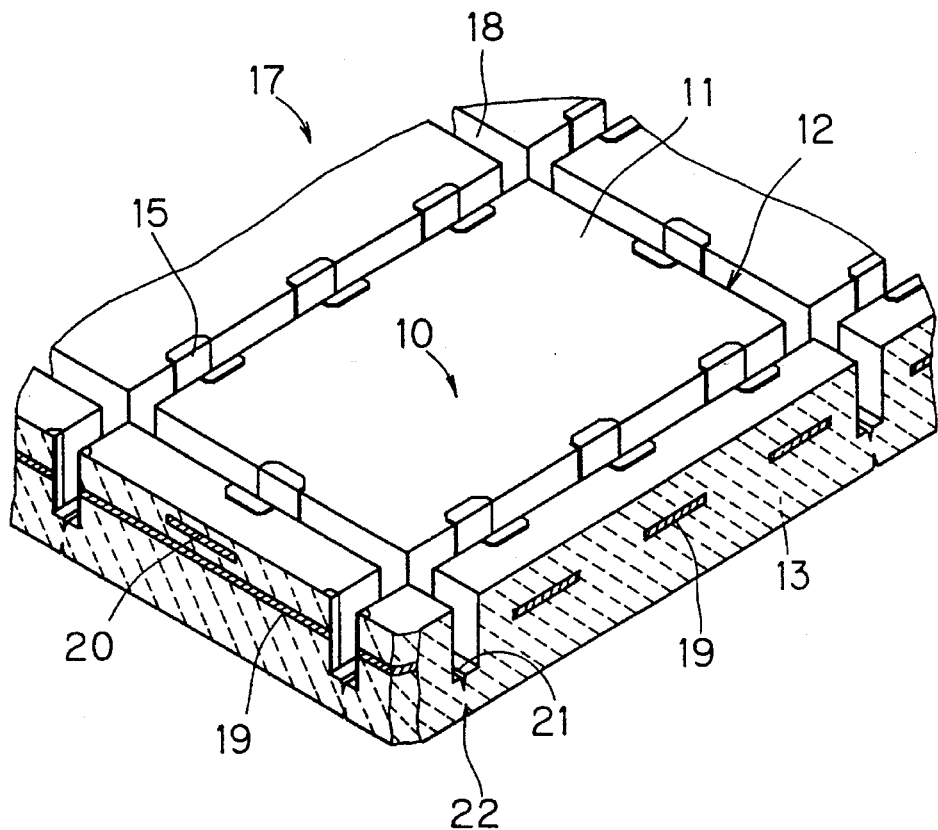
FIG. 2 is a perspective view showing a part of a mother laminate 17 which is prepared for obtaining the multilayer electronic component 10 shown in FIG. 1.
Figure 3:
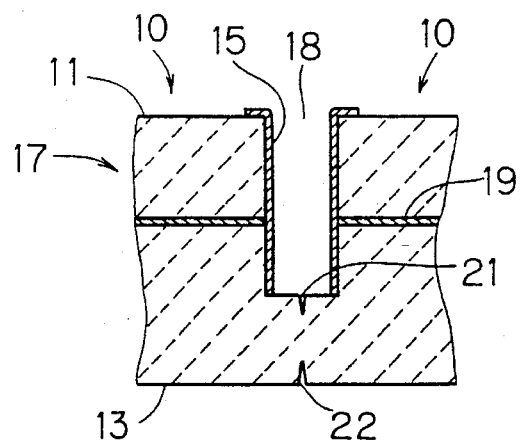
FIG. 3 is a sectional view showing a part of the mother laminate 17, appearing in FIG. 2, provided with external electrodes 15 in an enlarged manner.

In order to obtain the aforementioned multilayer electronic component 10, a mother laminate 17, which is only partially shown in FIGS. 2 and 3 is prepared. The mother laminate 17 is provided with grooves 18. The mother laminate 17, which is cut along cutting lines (not shown) corresponding to the positions of the grooves 18 for providing a plurality of multilayer electronic components 10, is formed by stacking a plurality of mother insulating sheets having internal circuit elements 19 and 20 for the respective multilayer electronic components 10 so that these internal circuit elements 19 and 20 are distributed in respective regions divided by the cutting lines. The internal circuit elements 19 and 20 shown in FIGS. 2 and 3 are mere examples, and the internal circuit elements are provided by conductor films and/or resistor films, via holes and the like, in addition to those shown in the figures.

In order to obtain the aforementioned mother laminate 17, the following steps are carried out, for example. According to this embodiment, the mother laminate 17 is provided by stacking mother insulating sheets which are formed by ceramic sheets.

First, sheet forming is performed by a doctor blade coater or the like, to obtain ceramic green sheets for serving as mother insulating sheets. Certain ceramic green sheets are provided with conductor films and/or resistor films for forming the internal circuit elements 19 and 20, and via holes as needed. Then, the mother insulating sheets are stacked with each other and pressed. Thus, the mother laminate 17 is obtained.

Then, the grooves 18 are formed in the mother laminate 17 by a dicing saw, for example. Due to such formation of the grooves 18, portions enclosed with the grooves 18 for defining the respective multilayer electronic components 10 are electrically independent of each other.

Then, the external electrodes 15 are applied onto side surfaces of the grooves 18. The external electrodes 15 are formed by applying suitable metal paste with a dispenser, for example, and the metal paste is thereafter dried. The external electrodes 15 are applied so as to not contact with each other, whereby the same are electrically independent of each other. According to this embodiment, the external electrodes 15 are formed to extend from positions in contact with bottom surfaces of the grooves 18 toward the upper major surface 11 of the mother laminate 17, as clearly shown in FIG. 3. FIGS. 2 and 3 show the external electrodes 15 and the internal circuit elements 19 in states electrically connected with each other.

Then, notches 21 and 22 are preferably formed in the bottom surfaces of the grooves 18 and the lower major surface 13 of the mother laminate 17 which is opposed thereto. Either of the notches 21 and 22 may be omitted.

Then, the mother laminate 17 is fired to simultaneously sinter the ceramic material forming the mother insulating sheets and the external electrodes 15. Thereafter the surface of the mother laminate 17 is subjected to formation of a conductor film and/or a resistor film, formation of an overcoat and application of solder resist at need. Further, the external electrodes 15 or another conductor film is plated as needed.

After the aforementioned steps are completed, electric characteristics of the respective multilayer electronic components 10 can be measured through the external electrodes 15, since the plurality of multilayer electronic components 10 included in the mother laminate 17 are electrically independent of each other.

After such measurement of the electric characteristics, other electronic components are mounted as needed on those of the multilayer electronic components 10 which are determined to be non-defectives, to form composite components. Each of such electronic components is mounted on the second major surface 13 of each laminate 12 shown in FIG. 1. The multilayer electronic components 10 may be shipped in this state.

Then, the mother laminate 17 is completely divided in the positions of the grooves 18, in order to obtain a plurality of multilayer electronic components 10 which are physically independent of each other. The mother laminate 17 can be readily divided along the grooves 18, like a chocolate bar. The aforementioned notches 21 and 22 are adapted to facilitate such division.

Thus, the multilayer electronic component 10 shown in FIG. 1 is obtained. As understood from the above description, the steps 16 result from formation of the aforementioned grooves 18.

A case may be mounted on the multilayer electronic component 10 to cover another electronic component which is mounted on the second major surface 13 of the laminate 12.

The aforementioned method of manufacturing multilayer electronic components 10 can be modified as follows:

For example, the firing step may be carried out the step of forming the notches 21 and 22, that of applying the external electrodes 15, or the step of forming the grooves 18. In this case, a step of firing the external electrodes 15 is separately carried out after application/drying. When the external electrodes 15 are applied after the firing step, the external electrodes 15 may be formed by evaporation or sputtering. When the notches 21 and 22 are formed after the firing step, further, the notches 21 and 22 can be formed with a laser beam.

The external electrodes 15 may be applied after formation of the notches 21 and 22. The mother laminate 17 may be divided along the grooves 18 with no previous formation of the notches 21 and 22, while portions between the bottom surfaces of the grooves 18 and the lower major surface 13 of the mother laminate 17 may be cut with a dicing saw which is smaller in edge thickness than that used for forming the grooves 18.

The external electrodes 15 may be in a state connected with each other between adjacent multilayer electronic components 10 in the stage of application thereof. In order to make the external electrodes 15 electrically independent of each other, a dicing saw having an edge thickness which is smaller than the width of each groove 18 or a laser beam may be applied, for example. Further, the notches 21 may be simultaneously formed by such application of the dicing saw or the laser beam.

In addition, the external electrodes 15 may be applied after the mother laminate 17 is divided along the grooves 18. In this case, the mother laminate 17 may be divided before firing to be then provided with the external electrodes 15 and simultaneously fired with the same, or may be divided after firing to be then provided with the external electrodes 15, which in turn are fired. In these cases, characteristics are measured for every product.

Figure 4:
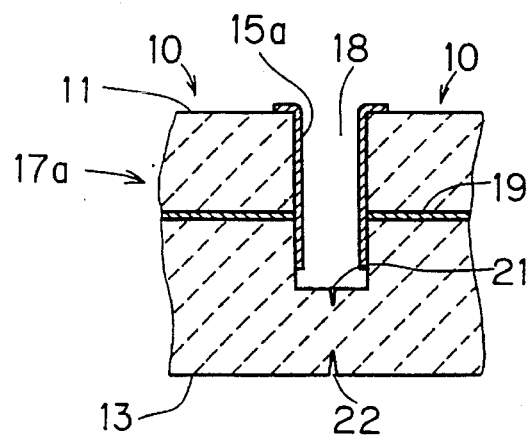
FIG. 4 is a sectional view corresponding to FIG. 3, showing a mother laminate 17a which is prepared according to another embodiment of the present invention.
Figure 5:
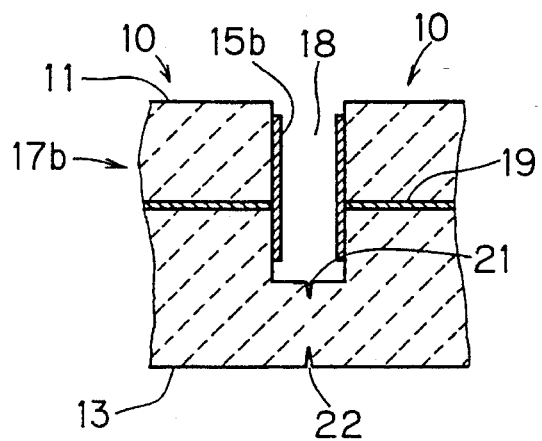
FIG. 5 is a sectional view corresponding to FIG. 3, showing a mother laminate 17b which is prepared according to still another embodiment of the present invention.
Figure 6:
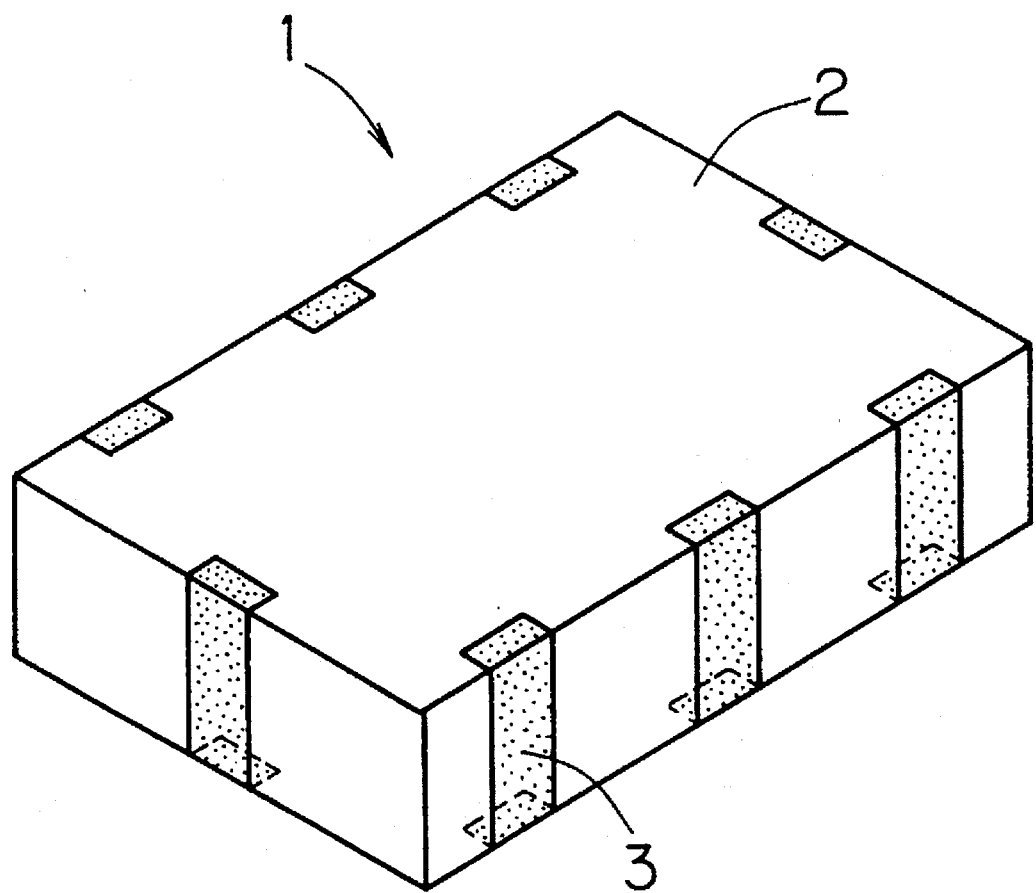
FIG. 6 is a perspective view showing the appearance of a conventional multilayer electronic component 1 which is of interest to the present invention.

FIGS. 4 and 5 are sectional views corresponding to FIG. 3, showing mother laminates 17a and 17b which are prepared according to further embodiments of the present invention respectively. Referring to FIGS. 4 and 5, elements corresponding to those shown in FIG. 3 are denoted by similar reference numerals, to omit redundant description.

The features of the embodiments shown in FIGS. 4 and 5 reside in modes of formation of external electrodes 15a and 15b respectively. The external electrodes 15a and 15b shown in FIGS. 4 and 5 do not reach bottom surfaces of grooves 18. Thus, it is possible to reliably prevent the external electrodes 15a and 15b from unintentionally entering conducting states between adjacent multilayer electronic components 10.

Further, the external electrodes 15b shown in FIG. 5 do not reach a first major surface 11. According to this embodiment, therefore, it is possible to also utilize the first major surface 11 as a mounting surface for other electronic components, with no interference by the external electrodes 15b.

According to the present invention, the insulating sheets are not restricted to ceramic sheets but may be prepared from sheets of another material.

What is claimed is:

1. A method for manufacturing multilayer electronic components, comprising the steps of:

preparing a mother laminate, to be cut along at least one cutting line for obtaining a plurality of multilayer electronic components, said mother laminate being formed by stacking a plurality of mother insulating sheets having internal circuit elements located thereon for forming said multilayer electronic components, said internal circuit elements being located in respective regions formed when said mother laminate is divided along said at least one cutting line;

forming a groove in said mother laminate along said at least one cutting line to electrically isolate adjacent electronic components;

applying a plurality of external electrodes on at least one surface of said groove so that said plurality of external electrodes are electrically connected with said internal circuit elements; and dividing said mother laminate along said at least one groove.

2. A method of manufacturing multilayer electronic components in accordance with claim 1, wherein said mother insulating sheets are ceramic green sheets, said method further comprising a step of firing said mother laminate.

3. A method of manufacturing multilayer electronic components in accordance with claim 1, further comprising a step of forming at least one notch in at least one of a bottom surface of said groove and a major surface of said mother laminate disposed opposite to said bottom surface so that said notch is located along said groove.

4. A method of manufacturing multilayer electronic components in accordance with claim 1, wherein said step of applying said external electrodes comprises a step of applying said external electrodes to both opposite side surfaces of said groove independently of each other.

5. A method of manufacturing multilayer electronic components in accordance with claim 1, wherein said step of applying said external electrodes comprises the steps of applying metal paste materials for defining said external electrodes to both opposite side surfaces of said groove so that said external electrodes are connected with each other, and dividing the metal paste materials for making said external electrodes independent of each other.

6. A method for measuring characteristics of multilayer electronic components, comprising the steps of:

preparing a mother laminate, to be cut along at least one cutting line for obtaining a plurality of multilayer electronic components, said mother laminate being formed by stacking a plurality of mother insulating sheets having internal circuit elements located thereon for forming said multilayer electronic components, said internal circuit elements being located in respective regions formed when said mother laminate is divided along said at least one cutting line;

forming a groove in said mother laminate along said at least one cutting line to electrically isolate adjacent electronic components;

applying a plurality of external electrodes on at least one surface of said groove to be electrically connected with said internal circuit elements; and measuring electric characteristics of at least one of said multilayer electronic components via said external electrodes while said multilayer electronic components are part of said mother laminate.

7. A method for measuring characteristics of multilayer electronic components in accordance with claim 6, wherein said step of applying said plurality of external electrodes comprises a step of applying said plurality of external electrodes to both opposite side surfaces of said groove independently of each other.

8. A method of measuring characteristics of multilayer electronic components in accordance with claim 6, wherein said step of applying said plurality of external electrodes comprises the steps of applying metal paste materials for defining said external electrodes to both opposite side surface of said groove so that said plurality of electrodes connected with each other, and dividing said metal paste materials for making said plurality of external electrodes independently of each other.

* * * * *